United States Patent [19]
Chow

[11] Patent Number: 5,808,492
[45] Date of Patent: Sep. 15, 1998

[54] CMOS BIDIRECTIONAL BUFFER WITHOUT ENABLE CONTROL SIGNAL

[75] Inventor: Hwang-Cherng Chow, Taiwan, China

[73] Assignee: Industrial Technology Research Institute, Hsinchu, Taiwan

[21] Appl. No.: 623,350

[22] Filed: Mar. 28, 1996

[51] Int. Cl.$^6$ .................................................. H03K 17/16
[52] U.S. Cl. ........................................ 327/108; 327/379
[58] Field of Search .................................... 327/108, 109, 327/111, 112, 310, 379–384, 564–566; 326/21, 26, 27, 28

[56] References Cited

U.S. PATENT DOCUMENTS

| | | | |
|---|---|---|---|
| 4,306,163 | 12/1981 | Blume, Jr. et al. | 326/86 |
| 4,829,199 | 5/1989 | Prater | 326/27 |
| 4,975,598 | 12/1990 | Borkar | 326/27 |
| 5,241,221 | 8/1993 | Fletcher et al. | 327/170 |
| 5,410,262 | 4/1995 | Kang | 327/108 |
| 5,512,854 | 4/1996 | Park | 327/108 |

*Primary Examiner*—Toan Tran
*Attorney, Agent, or Firm*—Meltzer, Lippe, Goldstein, Wolf, & Schlissel, P.C.

[57] ABSTRACT

A bidirectional buffer circuit is provided with a terminal, an input buffer, a steady state output driver and a strong output driver. The input buffer is for receiving an input signal from the terminal. The steady state output driver includes a weak driver for driving the terminal to a first voltage corresponding to a first particular logic value of the output signal. The weak driver has a limited driving capacity that can be out-driven by the input signal. The strong output driver is for driving the terminal to the first voltage. The strong output driver has a greater driving capacity than the weak output driver. Enable circuitry is also provided. The enable circuitry includes at least one delay circuit with a particular delay period. The enable circuitry enables the strong output driver in response to a transition of the output signal from a complement of the first logic value to the first logic value. However, the enable circuitry only enables the strong driver during the delay period of the delay element.

14 Claims, 4 Drawing Sheets

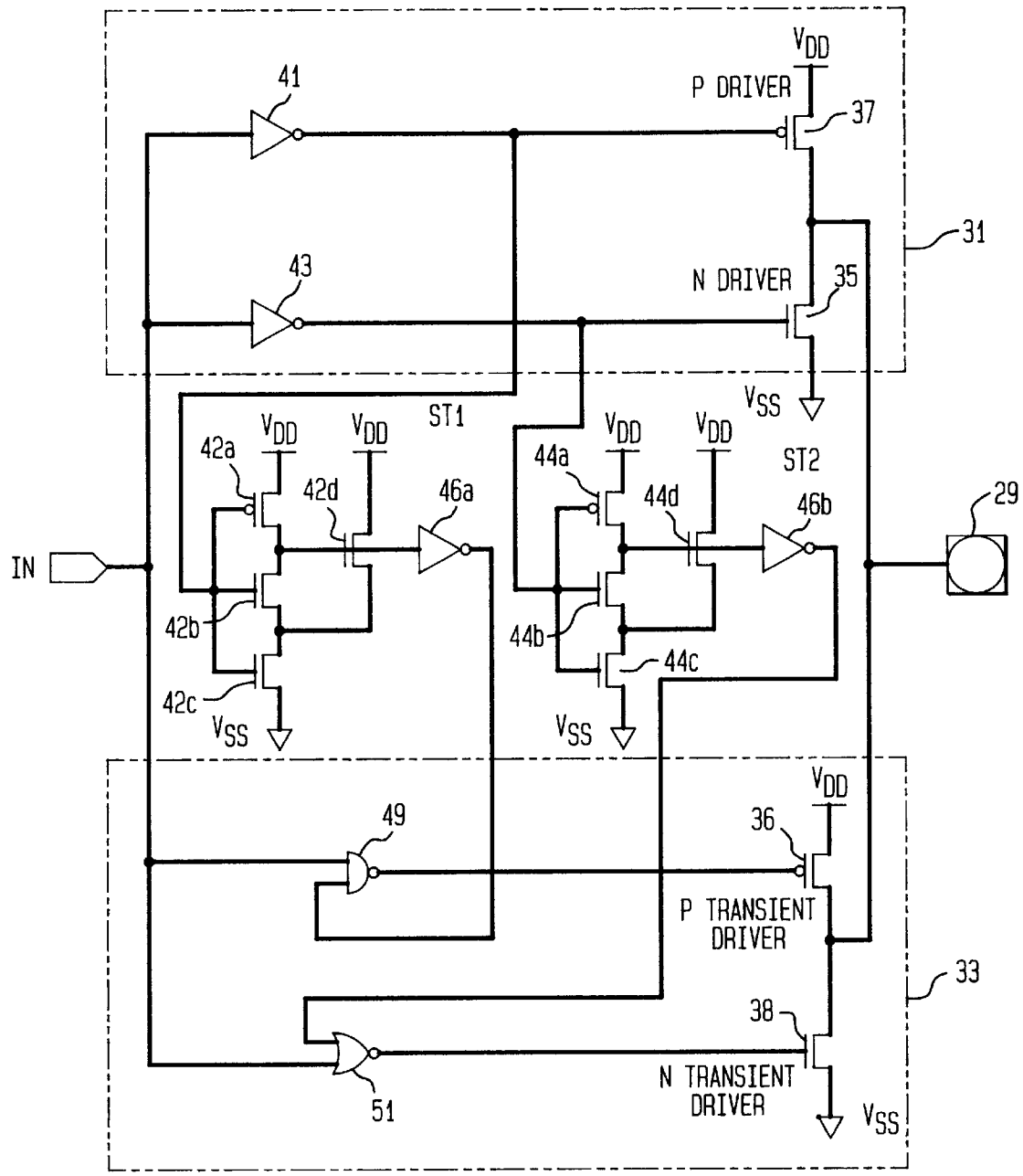

5,808,492

1

CMOS BIDIRECTIONAL BUFFER WITHOUT ENABLE CONTROL SIGNAL

RELATED APPLICATION

The subject matter of this application is related to the subject matter of the following patents and patent applications:

(1) U.S. patent application Ser. No. 08/623,583, entitled, "CMOS Output Buffer with Reduced L.di/dt Noise," filed on even date herewith for Hwang-Cherng Chow.

All of the above-listed patents and patent applications are commonly assigned to the assignee of this application and are incorporated herein by reference.

FIELD OF THE INVENTION

The present invention relates to integrated circuit design. Specifically, the present invention relates to the design of bidirectional buffers which can both output information produced by the integrated circuit and can receive inputted information from another device.

BACKGROUND OF THE INVENTION

A bidirectional buffer circuit is a circuit which both transmits output signals from, and receives input signals at, one or more pins of an integrated circuit chip. That is, a group of pins is provided for bidirectional transfer of data, the direction of transfer (i.e., input or output) depending on whether an input operation or output operation is selected at the integrated circuit chip. Conventional bidirectional buffers often use a tri-state or output enable (OE) signal for selecting whether an input or output operation is to be performed. For example, when the OE signal is high, the bidirectional buffer circuit translates data generated by internal or core circuits of the integrated circuit to an output signal. Typically, the "translation" step involves generating a voltage at a terminal or pad connected to a pin using an output driver comprising one or more large transistors, with a large current driving capacity for driving a high impedance load. When the OE signal is low, the output driver is disabled and instead functions as a high impedance load. An inputted signal can then be received at the terminal or pad via the pin.

Note that the OE signal controls the direction of data transfer at the pin. The OE signal must be internally generated or externally supplied. However, it is not possible to detect the state of the OE signal from the bidirectional data transfer pin of the integrated circuit alone. This can present a problem for properly synchronizing the inputting of data to the integrated circuit via the bidirectional transfer pin with the input state of the bidirectional buffer. To remedy this problem, the prior art has proposed bidirectional buffers which can receive an input signal when the terminal or pin is a particular logic value, e.g., logic value '1'. See U.S. Pat. No. 4,306,163. Thus, an external device can monitor the voltage of the terminal pin and determine that an input signal can be received if the particular logic value, i.e., logic value '1', is outputted.

FIG. 1 shows a conventional bidirectional buffer circuit 10 disclosed in INTEL, AP-252: DESIGNING WITH THE 80C51 BH, p. 8-5. Consider first the situation where the output signal is logic '0'. The complement of the output signal (a logic '1') is received at OR gate 15 which outputs a logic '1' or high voltage to the gate of transistor P101. This causes transistor P101 to remain off. Likewise, the complement of the output signal (logic '1') is received at the gate of transistor N101. This causes transistor N101 to remain on

2 thereby driving the terminal 17 to a low voltage or logic '0' value. The complement of the output signal (logic value '1') is also received at the gate of the transistor P102 thereby causing it to remain off. Furthermore, the logic '0' value of the terminal 17 is inputted to inverter 19 to produce the logic value '1' or high voltage. The high voltage is fed to the transistor P103 causing it to remain off.

Next, consider the situation where the output signal transitions from logic '0' to logic '1'. The complement of the output signal (logic '0' or low voltage) is received at the gate of transistor N101 which causes it to turn off. Likewise, the logic '0' or low voltage complement of the output signal is received at the gate of the transistor P102 causing it to turn on. The transistor P102 begins to drive the terminal to a logic '1' or high voltage. The inverter 11 receives the logic '0' complement of the output signal and, in response, outputs a logic '1' to a two-oscillator delay circuit 13. In response, the two oscillator delay circuit 13 outputs a logic '0' for two oscillations of a clock to OR gate 15. The OR gate 15 also receives the output signal logic '0' as an input. This causes the OR gate 15 to output a logic '0' or low voltage. The low voltage is received at transistor P101 which turns on and assists in driving the terminal to a high voltage for a period of two clock cycles. A logic '1' or high voltage is thus outputted from transistor P101 to the output terminal 17. This voltage is inverted by inverter 19 to produce a logic '0' or low voltage. The inverted low voltage is inputted to transistor P103 which also turns on.

When outputting a logic '1' value, the bidirectional circuit 10 may be used to receive an input signal. The input signal is applied at the terminal 17. A voltage generated at the terminal 17 by the applied input signal is received at the inverter 19 which outputs the complement of the inputted signal to the gate of the transistor P103 and to the inverter 21. In the case that the input signal is logic '0', i.e., a low voltage, the transistor P103 turns off and the transistor P102 is out-driven by the low voltage of the input signal applied to the terminal. In the case that the input signal is logic '1', i.e., a high voltage, the inverter 19 outputs a logic '0' or low-voltage to the gate of the transistor P103. This causes the transistor P103 to remain on so as to continue to drive the terminal 17 to the high voltage. The inverter 21 outputs the same polarity logic value as the input signal when enabled by the "read" signal. Otherwise, the inverter 21 outputs no logic value and remains in a high impedance state.

Note that the bidirectional buffer circuit 10 of FIG. 1 requires a two oscillator delay circuit 13. Such two oscillator delay circuits 13 can be difficult to construct since they are formed as delay elements with delay periods equal in duration to two clock periods of the clock speed of the integrated circuit chip. Thus, each two oscillator delay circuit 13 must be specially designed to match the clock speed of its respective integrated circuit. Note also, that such a bidirectional buffer circuit 10 cannot be implemented in many integrated circuit chips that operate at a selectable one of multiple clock speeds.

Another problem encountered with the design of bidirectional buffers, particularly as the clock speed is increased, is the generation of noise on the $V_{DD}$ and $V_{SS}$ power supply busses of the integrated circuit. Generally speaking, CMOS circuits require biasing voltages of $V_{DD}$ and $V_{SS}$ wherein $V_{DD}$ (typically 3 or 5 volts) is greater than $V_{SS}$ (typically 0 volts). Busses are provided for delivering each of these voltages to the individual components of the integrated circuit, including the large transistors which drive the terminal and pin to a particular output voltage. When these large transistors switch the voltage from a high voltage to a low voltage or from a low voltage to a high voltage in response to a transition of outputted logic value, a large current is generated to sink charge from, or to supply charge to, the terminal or pad which has a finite capacitance. As the speed of the integrated circuit increases, the sinking or supply current tends to vary more rapidly. This rapidly varying current develops a voltage across the pin lead inductances (bonding wire and packaging inductances) which in turn can impress noise signals on the power supply busses. The problem is compounded when several large transistors (e.g., for multiple pins) are provided since the noise can couple across the power supply busses between the large transistors resulting in the output of erroneous values.

The noise problem has previously been considered in the design of unidirectional output buffers which must have large, high current driving capacity transistors. FIG. 2 depicts a prior art output buffer disclosed in U.S. Pat. No. 5,063,308. The output buffer of FIG. 2 has a steady state driver 31 and a transient driver 33. In between transitions in the logic value of the output signal, the steady state driver 31 drives the terminal 29 to the appropriate logic value. When the output signal is a logic '1', the inverter 41 outputs a logic '0' or low voltage to the gate of the PMOS transistor 37 thereby turning it on so as to drive the terminal 29 to a high voltage. The inverter 43 outputs a low voltage to the gate of the NMOS transistor 35 which remains off. When the output signal is a logic '0', the inverter 43 outputs a logic '1' or high voltage to the NMOS transistor 35 thereby turning it on to drive the terminal 29 to a low voltage. Likewise, the inverter 41 outputs a high voltage to the gate of the transistor 37 which in response remains off.

The transient driver circuit 33 operates during a transition in logic state of the output signal to assist the steady state driver 31 in driving the terminal to the new voltage corresponding to the logic value to which the output signal transitions. Two Schmidt triggers ST1 and ST2 are provided for determining when the output signal transitions in logic value. Schmidt trigger ST1 includes three transistors 42a, 42b and 42c, connected in series, and a transistor 42d connected in parallel with transistors 42a and 42b. The outputs of the transistors 42a and 42b are also connected to an inverter 46a. Likewise, Schmidt trigger ST2 includes a series connection of three transistors 44a, 44b, 44c, a transistor 44d connected in parallel to the transistors 44a and 44b and an inverter 46b connected to the outputs of the transistors 44a and 44b. The Schmidt trigger ST1 monitors the voltage level at the gate of PMOS transistor 37 and the Schmidt trigger ST2 monitors the voltage at the gate of NMOS transistor 35.

Consider now a transition in logic value of the output signal from logic '1' to logic '0'. Initially, the Schmidt trigger ST2 outputs a logic '1' to the inverter 46b which, in turn, outputs a logic '0' to the NOR gate 51. The NOR gate 51 also receives the new output signal logic value '0' as a second input. The NOR gate 51 therefore outputs a logic '1' or high voltage to the gate of the transistor 38. The transistor 38 turns on and assist the transistor 35 in driving the terminal 29 to a low voltage. Meanwhile, the voltage at gate 35 charges up to $V_{DD}$. When the voltage level at the gate 35 reaches a predetermined trip level, the Schmidt trigger ST2 "trips," i.e., transitions from logic '1' to logic '0'. The inverter 46b outputs a logic '1' to the NOR gate 51 which in turn outputs a logic '0' or low voltage to the gate of NMOS transistor 38. As a result, the NMOS transistor 38 turns off.

Likewise, consider now a transition in logic value of the output signal from logic '0' to logic '1'. Initially, the Schmidt trigger ST1 outputs a logic '0' to the inverter 46a which, in turn, outputs a logic '1' to the NAND gate 49. The NAND gate 49 also receives the new output signal logic value '1' as a second input. The NAND gate 49 therefore outputs a logic '0' or low voltage to the gate of the PMOS transistor 36. The transistor 36 turns on and assist the transistor 37 in driving the terminal 29 to a high voltage. Meanwhile, the voltage at gate 37 discharges down to $V_{SS}$. When the voltage level at the gate 37 reaches a predetermined trip level, the Schmidt trigger ST1 "trips," i.e., transitions from logic '0' to logic '1'. The inverter 46a outputs a logic '0' to the NAND gate 49 which in turn outputs a logic '1' or high voltage to the gate of PMOS transistor 36. As a result, the PMOS transistor 36 turns off.

The transistors of the transient driver 33 are made larger than those of the steady state driver 31 so as to quickly discharge or charge the terminal 29 and achieve the appropriate output voltage quickly. However, because the large transistors are only turned on during a portion of the transition time, the coupling of noise onto the power busses is reduced.

The output buffer shown in FIG. 2 is disadvantageous because it requires two large transistors in its transient stage and two Schmidt triggers (one for each transistor in the transient stage). In addition, the use of a level trigger circuit in a buffer design can be disadvantageous because a different "trip" voltage level might be required for monitoring the gate of a PMOS transistor as opposed to monitoring the gate of an NMOS transistor. Furthermore, the design of level detector circuits to trip at precise levels can be complicated.

FIG. 3 shows another output buffer circuit 50. As shown, the complement of an output signal, an OE signal and the complement of the OE signal are received at an AC or transient driver 52 and a DC or steady state driver 54. In this case, the AC driver 52 includes two weak current driving NMOS transistors Q1 and Q2 and the DC driver 54 includes two strong current driving NMOS transistors Q3 and Q4. Gates G1–G5 are provided which, in response to a logic '1' valued output signal (logic '0' valued complement of the output signal), enable the transistor Q1 to drive the output terminal 59 to a high voltage or logic '1' value (and disable the transistor Q2). The gates G1–G5 furthermore, in response to a logic '0' valued output signal (logic '1' valued complement of the output signal), enable the transistor Q2 to drive the output terminal 59 to a low voltage or logic '0' value (and disable the transistor Q1). When OE is logic '0', both transistors Q1 and Q2 are disabled.

Also provided is a delay circuit 56 connected between an output of a NOR gate G9 and an input of a NOR gate G8. Likewise, a delay circuit 58 is connected between an output of the NOR gate G8 and an input of the NOR gate G9. The NOR gates G8 and G9 also receive the complement of OE. The gate G9 receives the output signal, via inverters G6 and G7, as an input. The gate G8 receives the complement of the output signal, via inverter G6, as an input. The output of the gate G8 is connected to the gate of transistor Q3 and the output of gate G9 is connected to the gate of transistor Q4. When the complement of OE is a logic '1', both gates G8 and G9 output a logic '0' or low voltage which disables both the transistors Q3 and Q4

Consider first the case where the output signal is a logic '1' and thus the complement of the output signal is logic '0'. The gate G8 receives logic '0' on each of its inputs (OE complement, output signal complement and output of gate G9 ) and therefore outputs a logic '1'. The gate G9 receives the logic '1' output signal directly, and the logic '1' output of the gate G8, via delay circuit 58. Therefore, the gate G9 outputs a logic '0'. Thus, the AC transistor Q1 and DC transistor Q3 are on. When the output signal transitions from logic '1' to logic '0', the transistors Q1 and Q3 are turned off quickly and the AC transistor Q2 is turned on quickly. The DC transistor Q3 turns off quickly because the change in logic value of the output signal changes one of its inputs to logic '1' without delay, thereby resulting in the NOR gate G8 quickly changing to outputting a logic '0'. Thus, initially, only the small driving capacity AC transistor Q2 turns on to slowly discharge the output terminal 59 thereby driving it to a low voltage (logic '0'). The transition in logic value of the NOR gate G8 from logic '1' to logic '0' takes a predetermined delay to propagate through the delay 58 before it is received at the gate G9. Eventually, after the predetermined delay period of the delay 58, the logic gate G9 receives the logic '0' output of the gate G8 from the delay 58. This changes the output of the NOR gate G9 to logic '1' (because now the gate G9 receives all logic '0' values as inputs). Thus, after the delay period of the delay circuit 58, the gate G9 changes its output to logic '1' thereby enabling the DC transistor Q4. Thus, eventually, DC transistor Q4 turns on and assists AC transistor Q2 in driving the output terminal 59 to a low voltage. Transistors Q2 and Q4 remain on thereafter to maintain the output terminal 59 voltage at a low voltage (logic '0').

Consider now the case where the output signal initially is logic '0' and thus the complement of the output signal is logic '1'. The AC transistor Q2 is on and the AC transistor Q1 is off. Each input to the gate G9 is a logic '0'. Thus, the gate G9 outputs a logic '1' to the DC transistor Q4 which is on. The gate G8 receives two logic '1' inputs (output of gate G9 and complement of output signal) and thus outputs a logic '0'. Thus, the DC transistor Q3 is off. When the output signal transitions to the logic '1' state, the AC transistor Q2 quickly turns off and the AC transistor Q1 quickly turns on. The gate G9 quickly transitions its output to logic '0' thereby quickly turning off the DC transistor Q4. Thus, initially, only the small driving capacity AC transistor Q1 is turned on for slowly charging up the output terminal 59 and driving it to a high voltage (logic '1'). The delay circuit 56 eventually propagates the logic '0' output of the gate G9, after a predetermined delay, to the gate G8. Likewise, the gate G8 receives the complement of the output signal, namely, logic '0'. Since all inputs to the gate G8 are now logic '0', the gate G8 transitions its output to a logic '1' (after the delay of the delay circuit 56). This turns on DC transistor Q3 which assists in driving the terminal to a high voltage (logic '1'). The transistors Q1 and Q3 thereafter remain on to maintain the output terminal 59 voltage at a high voltage.

By delaying the turn on of the large capacity (DC) transistors Q3 and Q4, the production of noise in the output buffer is reduced. However, once the large capacity transistors Q3 and Q4 are turned on, they remain on. The output buffer design is thus not amenable to modification as a bidirectional buffer for reception of an input signal. This is because the input signal cannot over-drive the large transistors Q3 and Q4 as would be necessary in the course of receiving the input signal. The only way to permit such a modification is to disable the transistors Q1–Q4 using the OE signal.

It is an object of the present invention to overcome the disadvantages of the prior art. In particular, it is an object of the present invention to provide a bidirectional buffer which has the features of low noise operation yet still enables reception of an input signal. It is also an object of the present invention to provide a simple design that can be implemented with few components.

SUMMARY OF THE INVENTION

These and other objects are achieved by the present invention. Note that two driver circuits are necessary in a CMOS output driver to drive a terminal with an output signal, one to drive it to a high voltage (in order to output a logic '1') and one to drive it to a low voltage (in order to output a logic '0'). However, the bidirectional buffer need only be designed so that one outputted voltage can be "over-ridden" by the input signal. Thus, a single weak driver circuit can be provided for driving the terminal to the respective output voltage yet permitting reception of the input signal (which can out-drive the weak driver circuit). The weak driver circuit may not have sufficient driving capacity to effect a fast transition. Therefore, the weak driver circuit is supplemented with a strong driver circuit. The strong driver circuit is enabled only for a limited period of time at the initiation of a transition so that: (1) the input signal can be received after the transition; (2) to reduce noise.

According to one embodiment, a bidirectional buffer circuit is provided with a terminal, an input buffer, a steady state output driver and a strong output driver. The input buffer is for receiving an input signal from the terminal. The steady state output driver includes a weak driver for driving the terminal to a first voltage corresponding to a first particular logic value of the output signal. The weak driver has a limited driving capacity that can be out-driven by the input signal. The strong output driver is for driving the terminal to the first voltage. The strong output driver has a greater driving capacity than the weak output driver. Enable circuitry is also provided. The enable circuitry includes at least one delay circuit with a particular delay period. The enable circuitry enables the strong output driver in response to a transition of the output signal from a complement of the first logic value to the first logic value. However, the enable circuitry only enables the strong driver during the delay period of the delay element.

Illustratively, the weak output driver is a low current driving capacity MOS transistor and the strong output driver is a MOS transistor with a higher current driving capacity than the weak output driver. The weak output driver and the strong output driver may be MOS transistors of the same channel conductivity type or of different channel conductivity types. While the input signal can out drive the weak output driver, the input signal illustratively cannot out drive the strong output driver.

According to another embodiment, the enable circuitry includes a two-input flip-flop and a logic gate. The two input flip-flop may illustratively be formed by two NAND gates which have cross-coupled feedback—the output of one NAND gate is fed back as an input to the other NAND gate and vice-versa. Illustratively, each feedback path of the flip-flop has a delay circuit with a particular delay. The flip-flop receives the output signal and its complement as its two inputs (the output signal being inputted to one NAND gate as a second input and its complement being inputted to the other NAND gate as its respective second input). In response to a transition in logic value of the output signal (and its complement) i.e., from logic '1' to logic '0' or from logic '0' to logic '1', the flip-flop transitions its output logic value. However, the transition in the outputted logic value is delayed by the delay of the delay circuits in the feedback path of the flip-flops. The outputted logic value is fed to a logic gate which also receives the output signal as a second input. The output of the logic circuit is connected to an enable input of the strong output driver. (For example, in the case that the strong output driver is a high current capacity transistor, the output of the logic circuit is connected to the gate of the transistor.) In response to a transition in logic value in the output signal, the logic gate transitions its logic value so as to enable the strong output driver but only until the flip-flop transitions its logic value, i.e., only for the delay period of the delay element in the feedback path of the flip-flop. After the logic circuit transitions its value, the logic gate again transitions its output to disable the strong output driver.

In short, a bidirectional driver circuit is provided which eliminates the need for an enable or data transfer direction control signal yet can output data at a high speed and with little noise.

BRIEF DESCRIPTION OF THE DRAWING

FIG. 2 shows a first conventional output buffer circuit.

DETAILED DESCRIPTION OF THE INVENTION

Figure 1:
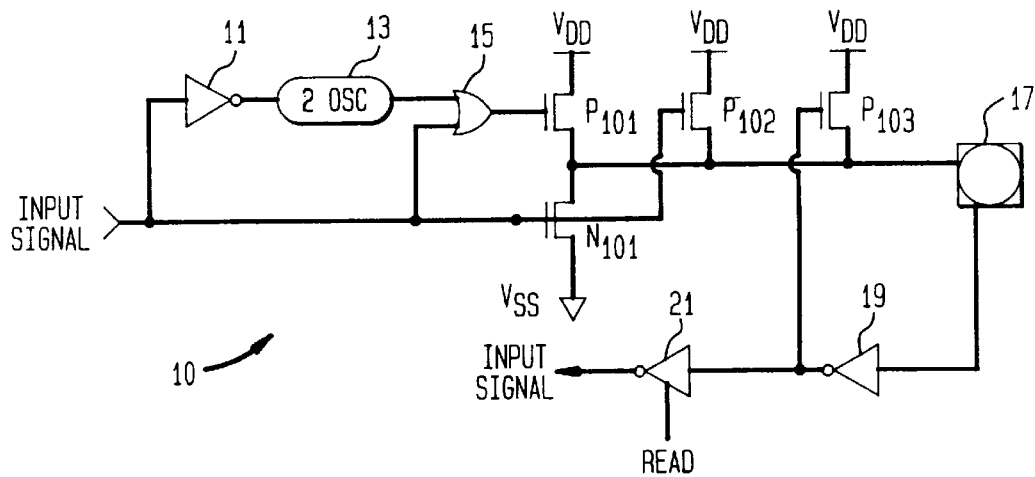
FIG. 1 shows a conventional bidirectional buffer circuit.
Figure 3:
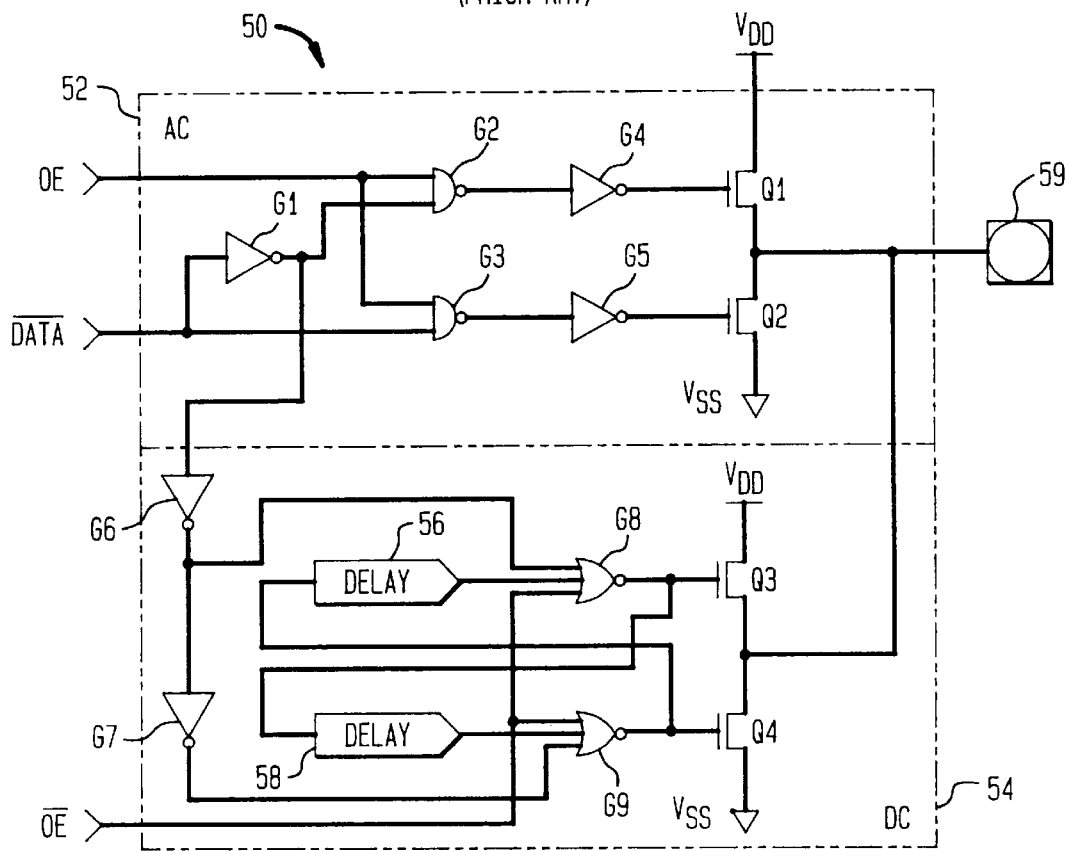
FIG. 3 shows a second conventional output buffer circuit.
Figure 4:
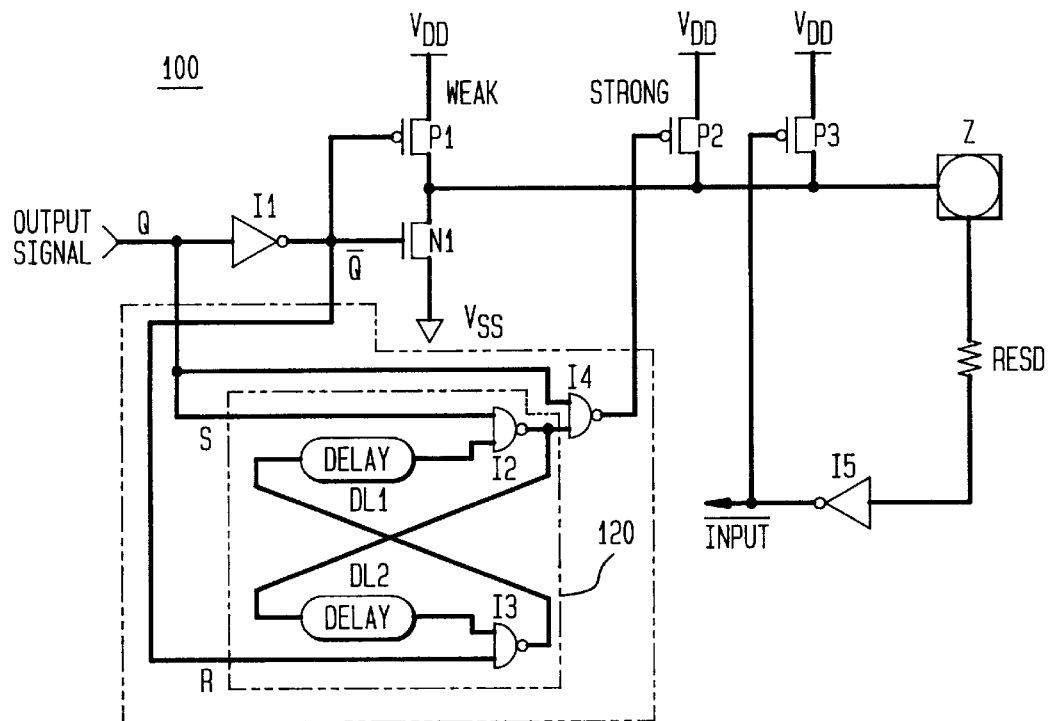
FIG. 4 shows a bidirectional buffer circuit according to an embodiment of the present invention.

FIG. 4 shows an embodiment of a bidirectional buffer 100 which forms part of an integrated circuit. The integrated circuit has internal circuitry (not shown) which generates an output signal for output and receives input signals from an external device. Illustratively, the bidirectional buffer 100 drives a terminal or pad Z (for example, connected to a pin of an integrated circuit chip package) to a voltage corresponding to the output signal Q. The bidirectional buffer 100 also receives the input signal from the terminal/pad Z.

The bidirectional circuit 100 has an input driver including the terminal Z, an inverter I5, a resistor Resd and a PMOS feedback transistor P3. The resistor Resd provides ESD (electrostatic discharge protection) to the integrated circuit. The bidirectional circuit 100 also has a steady-state output driver including a weak PMOS transistor P1 and an NMOS transistor N1. A transient output driver is also provided including a strong PMOS transistor P2. The weak transistor P1 is so called because it is small and has a small current driving capacity.

The transistors P1 and N1 of the steady state output driver are connected in a standard commonly connected drain configuration for an output buffer. Both the transistors N1 and P1 receive at their respective gates, the complement of the output signal outputted from the gate I1. When the output signal is a logic '1', the complement of the output signal is logic '0'. This causes the transistor P1 to turn on and drive the terminal Z to a high voltage (logic '1') while keeping the transistor N1 off. Likewise, when the output signal is a logic '0', the complement of the output signal is a logic '1'. This causes the transistor N1 to turn on and drive the terminal Z to a low voltage (logic '0') while keeping the transistor P1 off.

Enable circuitry 110 is also provided. The enable circuitry includes a two input memory 120, in the form of an RS flip-flop, and a logic gate I4. The RS flip-flop is formed by two NAND gates I2 and I3 with cross-coupled feedback. That is, the output of the NAND gate I2 is fed back as an input to the NAND gate I3. Likewise, the output of the NAND gate I3 is fed back as an input to the NAND gate I2. A delay element DL1 is inserted into the feedback path from the output of the gate I3 to the input of the gate I2. Likewise, a delay element DL2 is inserted into the feedback path from the output of the gate I2 to the input of the gate I3 (although, as discussed below, delay element DL2 is optional for the bidirectional buffer 100 and may be omitted). The purpose of the delay elements DL1 and DL2 is described in greater detail below. Suitable delay elements DL1 and DL2 with fixed, predetermined delays may designed, for example, from inverters. The memory 120 receives the output signal Q at its S or set input. The memory 120 also receives the complement of the output signal at its R or reset input. The S input is received as a second input of the NAND gate I2. The R input is received as a second input of the NAND gate I3.

The output of the memory 120 (the output of the NAND gate I2) is fed as one input to the logic gate I4 which is a NAND gate. (Note that this is a "complemented" output of the memory 120.) The NAND gate I4 also receives, as a second input, the output signal Q. The output of the NAND gate I4 is fed to the gate of the strong transistor P2.

The operation of the invention is now described. Consider first the steady-state or DC driving of the terminal/pad 19 where the output signal Q is logic '0'. The inverter I1 outputs a logic '1'. The R and S inputs to the memory 120 are logic '1' and logic '0', respectively. The memory 120 therefore outputs a logic '1' to the gate I4. (Again, note that this output is a "complemented" output of the memory 120). The gate I4 receives as its second input the logic '0' output signal. Thus, the NAND gate I4 outputs a logic '1' or high voltage to the strong transistor P2. As such the transistor P2 is turned off.

Meanwhile, the high voltage or logic '1' valued complement of the output signal is received at the transistors N1 and P1. This causes the weak transistor P1 to remain off but causes the transistor N1 to remain on. As such, the terminal/pad is driven to a low voltage or logic '0'. Note that the logic '0' or low voltage is fed via resistor Resd to the inverter I5 which outputs a logic '1' or high voltage. This high voltage output is fed to the gate of the transistor P3 thereby causing it to remain off.

Consider now the steady-state or DC driving of the terminal/pad 19 where the output signal Q is logic '1'. The inverter I1 outputs a logic '0'. The R and S inputs to the memory 120 are logic '0' and logic '1', respectively. The memory 120 therefore outputs a logic '0'. Furthermore, the NAND gate I4 receives the logic '1' output signal. Thus, the NAND gate I4 outputs a logic '1' to the gate of the strong transistor P2. As such, the strong transistor P2 is off.

Meanwhile, the low voltage or logic '0' valued complement of the output signal is received at the transistors N1 and P1. This causes the weak transistor P1 to remain on but causes the transistor N1 to remain off. As such, the terminal/pad is driven to a high voltage corresponding to a logic '1'. Note that the logic '1' or high voltage is fed via resistor Resd to the inverter I5 which outputs a logic '0' or low voltage. This low voltage output is fed to the gate of the transistor P3 thereby causing it to remain on.

Consider now that when the output voltage is logic '1', the primary driving transistor is the weak transistor P1. This transistor is purposely fabricated with a limited current driving capability. In particular, the weak transistor P1 cannot maintain the terminal/pad Z at the high voltage if a low voltage (logic '0' valued) input signal is received. This is because the weak transistor P1 cannot maintain the charge on the terminal/pad Z when the low voltage, logic '0' valued input signal sinks the charge on the pad. Stated another way, the input signal can out drive the weak transistor P1. This is desirable, since it enables receipt of the input signal. For example, an external device can monitor the voltage on the terminal/pad Z, i.e., the very terminal/pad Z to which the external device supplies the input signal. When the terminal/pad Z voltage is a predetermined voltage/logic value (in the case of the input buffer 100 shown in FIG. 4, a high voltage or logic '1'), the external device can input the input signal to the terminal/pad Z. The terminal/pad Z is driven to approximately the voltage of the input signal (possibly against any drive by the weak transistor P1 to a different voltage of a complementary logic value).

Consider now the case where the weak transistor P1 outputs a logic '1' and a logic '1' valued input signal is received at the terminal/pad Z. The logic '1' input signal drives the terminal/pad Z to a high voltage or logic '1' in concert with the transistor P1. The inverter I5 receives the input signal and outputs the complement of the input signal, i.e. a low voltage or logic '0'. The logic '0' value is fed back to the gate of the transistor P3 which remains on.

Now consider the case where the weak transistor P1 outputs a logic '1' and a logic '0' valued input signal is received at the terminal/pad Z. The logic '0' input signal drives the terminal/pad Z to a low voltage or logic '0' against the drive of the transistor P1 (which as noted above has an insufficient current driving capacity to maintain the supply of charge on the terminal/pad Z when the input signal drives it to a low voltage). The logic '0' valued input signal is received at the inverter I5 which outputs a logic '1'. This logic '1' or high voltage signal is fed back to the gate of the transistor P3 which turns off.

Consider now the transient or AC operation of the bidirectional buffer 100. The enable circuitry 110 is designed to enable the strong transistor P2 when a transition in logic value of the output signal from logic '0' to logic '1' is initiated. (Note that the gate I4 is a NAND gate which can only output an enabling logic '0' signal to the strong transistor when both of its inputs are logic '1'. This only occurs if the output signal is a logic '1'.) When the output signal transitions from logic '0' to logic '1' the transistor N1 turns off and the transistor P1 turns on, as described above.

Prior to the transition in output signal logic value, the output of the NAND gate I2 is logic '1' and the output of the NAND gate I3 is logic '0'. The R and S inputs are now changed to logic '0' and logic '1', respectively. The logic gate I3 therefore receives a logic '0' from the R input. This causes the output of the NAND gate to change to logic '1'. The logic '1' output of the NAND gate I3 is outputted to the delay element DL1 which delays receipt of the logic '1' output of the gate I3 at the input of the NAND gate I2 for a predetermined delay period of the delay element DL1. Thus, initially, the logic gate I2 receives a logic '1' from the S input and a logic '0' from the delay element DL1. The logic gate I2 therefore outputs a logic '1'. The logic gate I2 therefore outputs a logic '1' to the gate I4 until the new logic '1' output of the NAND gate I3 is received from the delay element DL1, namely, for the delay period of the delay element DL1.

The logic '1' output of the memory 120 is received at an input of the NAND gate I4 which also receives the logic '1' output signal Q. This causes the NAND gate I4 to output a logic '0' or low voltage to the strong transistor P2. In response, the strong transistor P2 turns on, initially when the output signal transitions in logic value from logic '0' to logic '1'. The strong transistor P2 is a large transistor with a high current driving capacity, indeed a stronger current driving capacity than the weak transistor P1. The transistor P2 assists the transistor P1 in driving the terminal/pad Z to the high voltage corresponding to the logic '1' valued output signal.

Eventually, after the delay period of the delay element DL1, the NAND gate I2 outputs a logic '0'. This causes the NAND gate I4 to output a logic '1' or high voltage to the strong transistor P2 thereby turning it off. Afterwards, the terminal/pad Z is driven to the high voltage by only the weak transistor P1.

Thus, the strong transistor P2 is enabled for assisting the weak transistor P1 for only a limited period of time in driving the terminal/pad Z to the high voltage. The following advantages are achieved by the bidirectional driver 100:

(1) Bidirectional transfer of data is provided at the terminal/pad Z without the need for a separate output enable or tri-state signal. Rather, the external device simply monitors the voltage of the terminal/pin to determine when the logic value/voltage of the weak transistor P1 is outputted (namely, logic '1') and can then drive the terminal/pad to a voltage corresponding to the input signal.

(2) Despite omitting the output enable signal, high speed operation is achieved. In particular, the strong transistor assists the weak transistor in driving the terminal/pad Z to the voltage corresponding to the new logic value to which the output signal transitions. Because the strong transistor has a high current driving capability, it dramatically speeds up the requisite drive time. However, the strong transistor is only enabled for a limited time so as not to interfere with the receipt of the input signal. That is, the input signal might not be able to out-drive the strong transistor, so the strong transistor must be disabled to enable receipt of the input signal.

(3) The strong transistor is only enabled for a short period of time during transition of the logic value of the output signal. This reduces the amount of noise which is coupled via the strong transistor onto the $V_{DD}$ and $V_{SS}$ power supply busses.

(4) The entire circuit can be implemented with four drive transistors. However, of these four transistors, only one large area occupying transistor, namely, the strong transistor P2, is necessary rather than two, as in the prior art. Likewise, only one enable circuit is necessary. Note that only three logic gates, two inverters and one delay element is necessary to construct the enable circuitry and glue logic.

(5) The enable circuitry is simple in that it requires only a single delay element, namely, the delay element DL1. (As described below, two delays DL1 and DL2 are provided for purposes of illustration and also to provide flexible operation for enabling either the strong drive transistor on either a logic '0' to logic '1' transition or a logic '1' to logic '0' transition.) Delay elements with particular predetermined delays are simple to construct.

Figure 5:
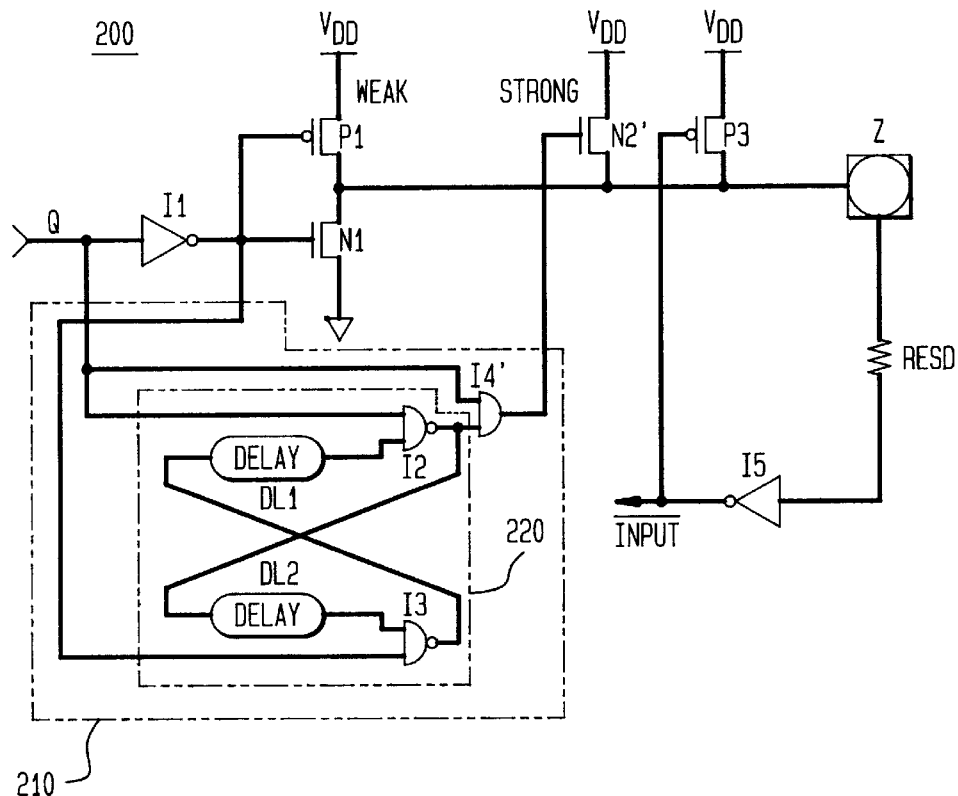
FIG. 5 shows a bidirectional buffer circuit according to a second embodiment of the present invention.

FIG. 5 shows another embodiment of a bidirectional buffer 200. In this case, a strong NMOS transistor N2' is substituted for the strong PMOS transistor P1 of FIG. 4. Furthermore, enable circuitry 200 is provided with an AND logic gate I4'. The AND logic gate I4' is provided so as to produce a complementary enabling signal as produced by the NAND circuit I4 of FIG. 4. (This is because an NMOS transistor N2' is enabled by a high gate voltage and disabled by a low gate voltage whereas the PMOS transistor P2 of FIG. 4 is enabled by a low gate voltage and disabled by a low gate voltage.) The memory circuit 220 is similar to the memory circuit 120 and operates in a similar fashion.

As noted above, two delay elements DL1 and DL2 are provided in the memory 120, even though only the delay DL1 is needed in operation. The delay element DL2 may thus be omitted in the bidirectional buffer 100. Alternatively, the enable circuitry 110 may be constructed with a generic memory 120 comprising both delays DL1 and DL2 thereby providing a flexible architecture with a choice of triggering logic value transition "directions," i.e., either logic '0' to logic '1' (using delay DL1) or logic '1' to logic '0' (using delay DL2).

Figure 6:
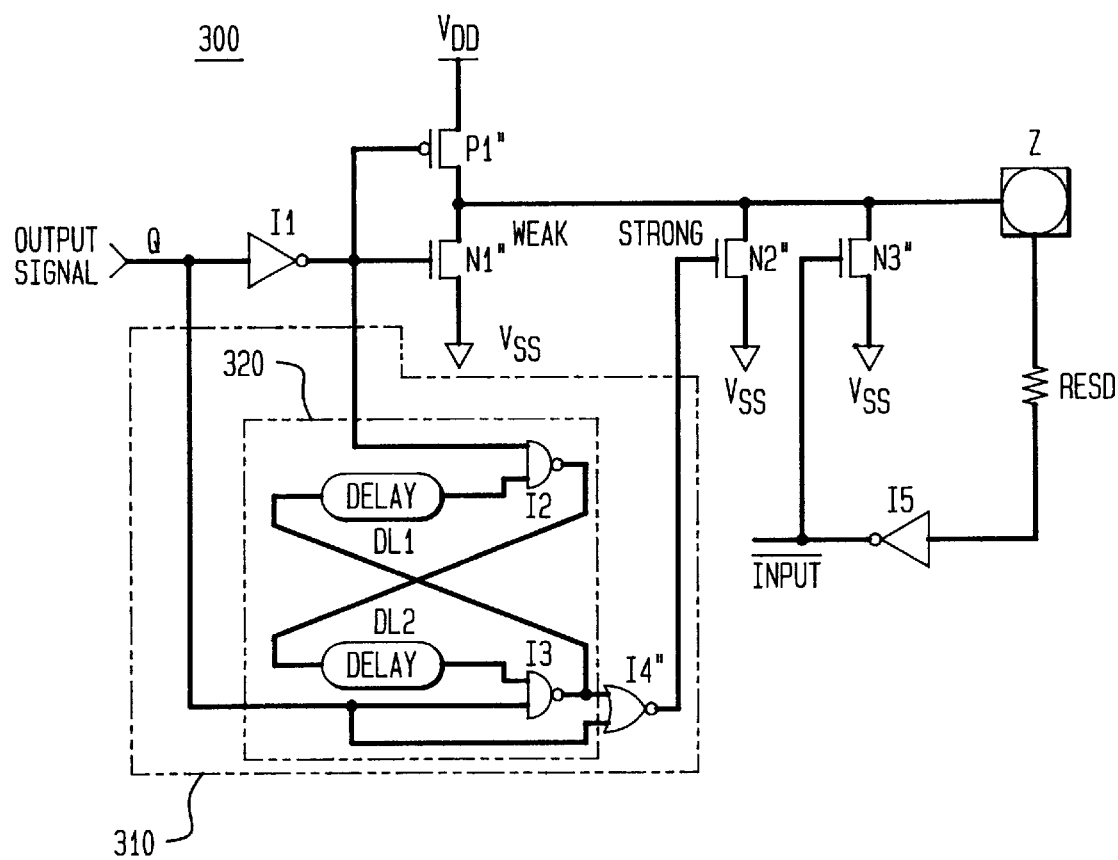
FIG. 6 shows a bidirectional buffer circuit according to a third embodiment of the present invention.

Consider, for example, the bidirectional buffer 300 shown in FIG. 6. This bidirectional buffer 300 is similar to the bidirectional buffer 100 shown in FIG. 4. In the buffer 300, the weak transistor is N1" and the strong transistor is N2". The transistor P1" is fabricated as an ordinary output driver transistor. The input buffer feedback transistor N3" is also an NMOS transistor. The input signal may be received when only the weak transistor N1" is enabled, i.e., when the bidirectional buffer 300 outputs a logic '0' or low voltage during steady state conditions.

The enable circuitry 310 includes a NOR gate I4" which receives the output of the NAND gate I3" (which serves as the output of the memory 320). Unlike the memory 120, the memory 320 outputs a logic '0' for a delay period of the delay element DL2 in response to a transition of the output signal from logic '1' to logic '0'. This is received at the NOR gate I4" which also receives the logic '0' valued output signal. In response, the NOR gate I4" outputs a logic '1' or high voltage to the gate of the strong transistor N2". This causes the strong transistor N2" to turn on and assist the weak transistor N1" in driving the terminal Z to the low voltage corresponding to the logic '0' value to which the output signal transitions. Eventually, after the delay period of the delay element DL2, the gate I3" changes its logic value to logic '1'. This causes the NOR gate I4" to output a logic '0' or low voltage to the strong transistor N2" which turns it off. Again, the strong transistor N2" is only turned on for a limited period of time when a particular direction of logic value transition occurs, in this case, from logic '1' to logic '0'. (Note that the NOR gate I4" can only output an enabling logic '1' or high voltage to the gate of the strong transistor N2" when a logic '0' is received at both inputs. Since one input is the output signal, the enable circuit 310 can only enable the transistor N2" during a logic '1' to logic '0' transition.)

Note that in FIG. 6, the input buffer feedback transistor N3" is an NMOS transistor. When the input signal is logic '1', the inverter I5 outputs a logic '0' or low voltage to the gate of the transistor N3". This causes the transistor N3" to turn off. However, when the input signal is a logic '0', the inverter I5 outputs a logic '1' or high voltage to the gate of the transistor N3". This causes the transistor N3" to remain on so as to continually assist in driving the terminal/pad Z to logic '0' or low voltage.

In short, a bidirectional buffer circuit is provided with a terminal, an input buffer, a steady state output driver and a strong output driver. The input buffer is for receiving an input signal from the terminal. The steady state output driver includes a weak driver for driving the terminal to a first voltage corresponding to a first particular logic value of the output signal. The weak driver has a limited driving capacity that can be out-driven by the input signal. The strong output driver is for driving the terminal to the first voltage. The strong output driver has a greater driving capacity than the weak output driver. Enable circuitry is also provided. The enable circuitry includes at least one delay circuit with a particular delay period. The enable circuitry enables the strong output driver in response to a transition of the output signal from a complement of the first logic value to the first logic value. However, the enable circuitry only enables the strong driver during the delay period of the delay element.

Finally, the above-discussion is intended to be merely illustrative of the invention. Numerous alternative embodiments may be devised by those having ordinary skill in the art without departing from the spirit and scope of the following claims.

The claimed invention is:

1. A bidirectional buffer for receiving an input signal from an external device and for outputting an output signal generated by a first circuit comprising:

a terminal for receiving said input signal from said external device, an input buffer for receiving said input signal from said terminal, a steady state output driver, including a weak driver responding to an output signal generated by a first circuit for driving said terminal to a first voltage corresponding to a first particular logic value of said output signal, said weak driver having a limited driving capacity that can be out-driven by said input signal received at said terminal from the external device, a strong output driver, for driving said terminal to said first voltage, said strong output driver having a greater driving capacity than said weak output driver, and enable circuitry, comprising a two input memory circuit, said two input memory circuit including at least one delay circuit with a delay period, said two input memory for responding to said output signal and a complement of said output signal and for enabling said strong output driver in response to a transition of said output signal from a complement of said first logic value to said first logic value but only during said delay period.

2. A bidirectional buffer for receiving an input signal from an external device and for outputting an output signal generated by a first circuit comprising:

a terminal for receiving said input signal from said external device, an input buffer for receiving said input signal from said terminal, a steady state output driver, including a weak driver responding to said output signal generated by said first circuit for driving said terminal to a first voltage corresponding to a first particular logic value of said output signal, said weak driver having a limited driving capacity that can be out-driven by said input signal, received by said terminal from the external device, a strong output driver, for driving said terminal to said first voltage, said strong output driver having a greater driving capacity than said weak output driver, and enable circuitry, including at least one delay circuit with a delay period, for enabling said strong output driver in response to a transition of said output signal from a complement of said first logic value to said first logic value but only during said delay period, said enable circuitry further comprising:

a two-input flip-flop circuit comprising first and second NAND gates, an output of said first NAND gate being fed back as an input to said second NAND gate and serving as an output of said flip-flop circuit, and a delay element being connected in series between an output of said second NAND gate and an input of said first NAND gate, said flip-flop receiving as inputs, said output signal and a complement of said output signal, and a logic gate receiving said output signal and said output of said flip-flop circuit and outputting a signal which enables said strong driver, for only a delay of said delay element, in response to a particular transition from a complement of said first logic value to said first logic value.

3. The bidirectional buffer of claim 1 wherein said terminal receives said input signal only when said weak driver drives said terminal to said first voltage but not when said strong driver drives said terminal to said first voltage.

4. The bidirectional buffer of claim 1 wherein said weak output driver comprises a MOS transistor and wherein said strong output driver comprises a MOS transistor having a channel with the same conductivity type as said MOS transistor of said weak output driver.

5. The bidirectional buffer of claim 1 wherein said weak output driver comprises a MOS transistor and wherein said strong output driver comprises a MOS transistor having a channel with an opposite conductivity type as said MOS transistor of said weak output driver.

6. The bidirectional buffer of claim 1 wherein said weak driver comprises a first MOS transistor and wherein said steady state output driver further comprises a second MOS transistor with an opposite conductivity type channel as said first MOS transistor, said first and second MOS transistors having their drains connected to said terminal and receiving, simultaneously at their gates, a complement of said output signal.

7. The bidirectional buffer of claim 6 further comprising:
a transistor responsive to a particular logic value of a signal that depends upon an output of said input buffer for driving said terminal to a voltage corresponding to a particular logic value of said input signal.

8. A bidirectional buffer for receiving an input signal from an external device and for outputting an output signal generated by a first circuit comprising:
a terminal, for receiving said input signal from said external device,
a first transistor connected to said terminal and responsive to a first logic value of an output signal, generated by said first circuit for driving said terminal to a first voltage corresponding to said first logic value,
a second transistor, connected to said terminal and responsive to a second logic value, which is a complement of said first logic value, of said output signal, for driving said terminal to a second voltage corresponding to said second logic value,
a third transistor, connected to said terminal for driving said terminal to said second voltage, said third transistor having a greater driving capacity than said second transistor,
an input buffer, receiving said input signal from the external device which can out drive said second transistor, and
enable circuitry, including a two-input memory, said two input memory comprising a delay element with a predetermined delay, said two input memory for responding to said output signal and a complement of said output signal, and for enabling said third transistor, in response to a transition of said output signal from said first logic value to said second logic value but only for a time equal to said predetermined delay.

9. A bidirectional buffer for receiving an input signal from an external device and for outputting an output signal generated by a first circuit comprising:
a terminal, for receiving said input signal from said external device,
a first transistor connected to said terminal and responsive to a first logic value of an output signal generated by said first circuit, said output signal for driving said terminal to a first voltage corresponding to said first logic value,
a second transistor, connected to said terminal and responsive to a second logic value, which is a complement of said first logic value, of said output signal, for driving said terminal to a second voltage corresponding to said second logic value,
a third transistor, connected to said terminal for driving said terminal to said second voltage, said third transistor having a greater driving capacity than said second transistor,
an input buffer, said input buffer connected to said terminal, said input buffer receives said input signal which can out drive said second transistor, and
enable circuitry, including a two-input memory, said two input memory comprising a delay element with a predetermined delay, said two input memory receiving said output signal and a complement of said output signal, said enable circuitry for responding to a transition of said output signal from said first logic value to said second logic value and for enabling said third transistor but only for a time equal to said predetermined delay, said enable circuitry further comprising:
a logic gate which receives an output of said two-input memory, and said output signal, as inputs, said logic gate only outputting an enable signal if said output signal is said second logic value, and only so long as said two-input memory outputs a particular logic value,
said two-input memory for responding to said transition from said first logic value to said second logic value and for outputting said particular value for only a time equal to said predetermined delay.

10. The bidirectional buffer of claim 8 further comprising:
a fourth transistor responsive to a particular logic value of a signal that depends on an output of said input buffer for driving said terminal to a voltage corresponding to a particular logic value of said input signal.

11. An integrated circuit comprising:
a terminal for receiving an input signal from an external device,
an input buffer for receiving said input signal from said terminal,
a steady state output driver, including a weak driver for responding to an output signal generated by a first circuit and for driving said terminal to a first voltage corresponding to a first particular logic value of said output signal, said weak driver having a limited driving capacity that can be out-driven by said input signal received at said terminal from the external device,
a strong output driver, for driving said terminal to said first voltage, said strong output driver having a greater driving capacity than said weak output driver, and enable circuitry, comprising a two input memory circuit, said two input memory circuit including at least one delay circuit with a delay period, said two input memory circuit responding to said output signal and a complement of said output signal by enabling said strong output driver in response to a transition of said output signal from a complement of said first logic value to said first logic value but only during said delay period;

wherein said first circuit is for receiving a signal outputted from said input buffer and for generating said output signal.

12. The bidirectional buffer of claim 1 wherein said two input memory circuit comprises:

first and second logic gates, an output of first logic gate being fed back as an input to said second logic gate and serving as an output of said two input memory circuit, and a delay element being connected in series between an output of said second logic gate and an input of said first logic gate, and wherein said enable circuitry further comprises a third logic gate receiving said output signal and said output of said two input memory circuit and outputting a signal which enables said strong driver, for only a delay of said delay element, in response to a particular transition of said output signal from a second logic value to said first logic value, said second logic value being the complement of said first logic value.

13. The bidirectional buffer of 8 wherein said two input memory circuit comprises:

first and second logic gates, an output of first logic gate being fed back as an input to said second logic gate and serving as an output of said two input memory circuit, and a delay element being connected in series between an output of said second logic gate and an input of said first logic gate, and wherein said enable circuitry further comprises a third logic gate receiving said output signal and said output of said two input memory circuit and outputting a signal which enables said strong driver, for only a delay of said delay element, in response to a particular transition of said output signal from said first logic value to said second logic value, said second logic value being the complement of said first logic value.

14. The bidirectional buffer of 11 wherein said two input memory circuit comprises:

first and second logic gates, an output of first logic gate being fed back as an input to said second logic gate and serving as an output of said two input memory circuit, and a delay element being connected in series between an output of said second logic gate and an input of said first logic gate, and wherein said enable circuitry further comprises a third logic gate receiving said output signal and said output of said two input memory circuit and outputting a signal which enables said strong driver, for only a delay of said delay element, in response to a particular transition of said output signal from a second logic value to said first logic value, said second logic value being the complement of said first logic value.

\* \* \* \* \*